(12) United States Patent
Hadeler (10) Patent No.: US 9,231,800 B2
(45) Date of Patent: Jan. 5, 2016

(54) METHOD FOR TRANSMITTING DATA (75) Inventor: Michael Hadeler, Pliezhausen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 981 days.

(21) Appl. No.: 12/734,614

(22) PCT Filed: Sep. 15, 2008

(86) PCT No.: PCT/EP2008/062233
§ 371 (c)(1),
(2), (4) Date: Aug. 25, 2010

(87) PCT Pub. No.: WO2009/062771
PCT Pub. Date: May 22, 2009

(65) Prior Publication Data
US 2010/0312918 A1    Dec. 9, 2010

(30) Foreign Application Priority Data

Nov. 12, 2007   (DE) .......................... 10 2007 053 811

(51) Int. Cl.
*H04L 25/49* (2006.01)
*H03M 7/14* (2006.01)

(52) U.S. Cl.
CPC ............. *H04L 25/4906* (2013.01); *H03M 7/14* (2013.01); *H04L 25/4902* (2013.01)

(58) Field of Classification Search
CPC ... H04L 25/4902; H04L 25/4906; H03M 7/14
See application file for complete search history.

(56) References Cited

U.S. PATENT DOCUMENTS

| 4,864,303 | A | * | 9/1989 | Ofek ................................ 341/95 |
| 5,304,996 | A | * | 4/1994 | Hsu et al. ......................... 341/95 |
| 6,812,870 | B1 | * | 11/2004 | Kryzak et al. .................... 341/95 |
| 6,876,315 | B1 | * | 4/2005 | Widmer ........................... 341/58 |
| 6,977,599 | B2 | * | 12/2005 | Widmer ........................... 341/59 |
| 7,889,231 | B2 | * | 2/2011 | Stumber et al. ............... 348/148 |

FOREIGN PATENT DOCUMENTS

| DE | 10 2004 038 495 | 3/2006 |
| JP | 5-227035 | 9/1993 |

* cited by examiner

*Primary Examiner* — Ernest Unelus
*Assistant Examiner* — Ronald Modo
(74) *Attorney, Agent, or Firm* — Kenyon & Kenyon LLP (57) ABSTRACT

A method for transmitting data between two devices, in which data frames of the data are temporally adjusted in such a way that a constant number of flanks is used for the data frames. In addition, a related system, computer program, and computer program product are also described.

14 Claims, 5 Drawing Sheets

|    | 0 1 2 3 4 5 | 0 1 2 3 4 5 6 7 |
|----|-------------|-----------------|
| 45 | 0 0 1 0 0 0 0 1 0 1 | |
| 46 | 0 0 1 1 0 1 1 1 0 1 | |
| 47 | 0 0 1 1 0 1 1 0 0 1 | |
| 48 | 0 0 1 1 0 1 0 0 0 1 | |
| 49 | 0 0 1 1 0 0 1 1 0 1 | |
| 50 | 0 0 1 1 0 0 1 0 0 1 | |
| 51 | 0 0 1 1 0 0 0 1 0 1 | |
| 52 | 0 0 1 1 1 0 1 1 0 1 | |
| 53 | 0 0 1 1 1 0 1 0 0 1 | |
| 54 | 0 0 1 1 1 0 0 1 0 1 | |
| 55 | 0 0 1 1 1 1 0 1 0 1 | |
| 56 | 0 0 0 1 0 1 1 1 0 1 | |
| 57 | 0 0 0 1 0 1 1 0 0 1 | |
| 58 | 0 0 0 1 0 1 0 0 0 1 | |
| 59 | 0 0 0 1 0 0 1 1 0 1 | |
| 60 | 0 0 0 1 0 0 1 0 0 1 | |
| 61 | 0 0 0 1 0 0 0 1 0 1 | |
| 62 | 0 0 0 1 1 0 1 1 0 1 | |
| 63 | 0 0 0 1 1 0 1 0 0 1 | |
| 64 | 0 0 0 1 1 0 0 1 0 1 | |
| 65 | 0 0 0 1 1 1 0 1 0 1 | |
| 66 | 0 0 0 0 1 0 1 1 0 1 | |
| 67 | 0 0 0 0 1 0 1 0 0 1 | |
| 68 | 0 0 0 0 1 0 0 1 0 1 | |
| 69 | 0 0 0 0 1 1 0 1 0 1 | |

METHOD FOR TRANSMITTING DATA

FIELD OF THE INVENTION

The present invention relates to a method as well as a system for transmitting data, to a computer program, and a computer program product.

BACKGROUND INFORMATION

A camera link is an interface between a camera and a control device. More specifically, if the data are transmitted from the camera to the control device then this link is referred to as downlink. A link for transmitting from the control device to the camera is called an uplink. One of the requirements for such interfaces is that large data quantities are able to be transmitted on the lowest possible frequency when transmitting image data.

German printed patent publication DE 10 2004 038 495 A1 relates to an image recording system having at least one camera, a receiver as well as a signal connection between the at least one camera and the receiver. The receiver is equipped with an arrangement for generating a PWM-encoded signal, the image recording system including at least one signal connection for the transmission of this PWM-encoded signal from the receiver to the camera. Furthermore, an arrangement for decoding the PWM-encoded signal and for recovering a clock signal from the PWM-encoded signal are provided in the camera.

SUMMARY OF THE INVENTION

The exemplary embodiments and/or exemplary methods of the present invention relates to a method for transmitting data between two devices, in which data frames of the data are temporally adjusted in such a way that a constant number of flanks is used for the data frames.

The exemplary embodiments and/or exemplary methods of the present invention is suitable, among other things, for the transmission of data frames designed as image frames, and thus for image frames for visual or audio-visual applications. A data frame is made up of a sequence of zeros and ones. A change between these two possible values within a data frame is referred to as a flank, a change from a zero to a one constituting a rising flank, and a change from a one to a zero, a falling flank.

In one development, using a protocol, data developed as image data are therefore able to be transmitted between a device implemented as camera to a device implemented as control device, so that the method may be used for transmitting the image data from the camera to the control device, which transmission is referred to as downlink.

In one specific embodiment, the data frames may be clocked and thus be set temporally in such a way that a constant number of flanks is used for all data frames, the constant number of flanks being defined by a bit length of the data frames.

In a first variant, two rising and two falling flanks are used for data frames having a length of 8 bits. In a second variant, three rising and three falling flanks are used for data frames having a length of 10 bits.

The system according to the exemplary embodiments and/or exemplary methods of the present invention is configured to transmit data between two devices. The system temporally sets data frames of the data in such a way that the data frames have a constant number of flanks.

The system may include a link between a device designed as camera and a device designed as control device, the link being designed as a single line, for example. Furthermore, the system may have a module for providing the protocol for the temporal setting of the data frames.

The described system is designed to execute all of the steps of the introduced method. Individual steps of this method are also able to be implemented by individual components of the system. Furthermore, functions of the system or functions of individual components of the system may be implemented as steps of the method.

In addition, the invention relates to a computer program having a program code arrangement for implementing all of the steps of a described method when the computer program is executed on a computer or a corresponding central processing unit, in particular a system according to the exemplary embodiments and/or exemplary methods of the present invention.

The computer program product according to the present invention having a program code arrangement, which is stored on a computer-readable data carrier, is designed to execute all of the steps of a described method when the computer program is executed on a computer or a corresponding processing unit, in particular a system according to the exemplary embodiments and/or exemplary methods of the present invention.

Using the exemplary embodiments and/or exemplary methods of the present invention, a single-line camera-link protocol is able to be realized. Thus, the exemplary embodiments and/or exemplary methods of the present invention implements a camera-downlink protocol, among other things, which allows the data to be transmitted on a single line, the protocol being able, for instance, to be received also in an FPGA as one component of the second device, i.e., the control device. A pair of lines on which a high data quantity is transmitted using a differential transmission method, e.g., LVDS (low voltage differential signaling), is typically referred to as single line here. The protocol simultaneously encompasses a relatively high density of transmitted data. At 60 bits of payload data per 120 bits, up to 12 bits of payload data per 10 bits are able to be transmitted via an interface designed as camera link which includes two data lines and one clock line.

The protocol allows for a simple clock recovery and is able to be received in an FPGA. One basis for the simple clock recovery is that the protocol uses a constant number of flanks per data frame. This makes it possible to implement the clock recovery with the aid of a so-called divider.

In one development of the exemplary embodiments and/or exemplary methods of the present invention, the data frame timing or clocking of the data frames is able to be clearly defined, so that it is able to be circumvented only with difficulty. The exemplary embodiments and/or exemplary methods of the present invention relates to two possible variants, among others, i.e., 8 bit frames or frames having two rising flanks, and 10 bit frames or frames having three rising flanks.

For a clock recovery it is usually provided that the receiver divide the received data signal by four, for example, with the aid of the divider. Depending on the flank that is selected, a plurality of possible signals results. In the protocol described here, the flanks in one of the two signals are constant. The signal may be used as reference signal for a PLL circuit, which generates the data clock using which the received signal is sampled. The correct reference signal for the PLL circuit is detected by checking a pulse duty factor or duty cycles. In a reference signal, it is 50% and constant. In the other signals, it varies as a function of time.

A transmission or forwarding of the data, which include packages with data frames, between the two devices is possible in a wireless or wire-bound manner.

The two mentioned variants of the protocol may be provided within the framework of an application of the exemplary embodiments and/or exemplary methods of the present invention. To begin with, a first variant is described, according to which a data or image frame, or, abbreviated, a frame, has a bit length of 8 bits. In a second variant, the data frame or frame has a length of 10 bits. Furthermore, the exemplary embodiments and/or exemplary methods of the present invention is also suitable for data frames having other bit lengths.

In a camera-link protocol for a single-line connection, a bit length of 8 bits is specified according to the first variant, so that an image or data frame is made up of 8 bits from a zeroth to a seventh bit. The zeroth bit is always 1, and the seventh bit always zero. Furthermore, the first up to and including the sixth bit are used for coding, the first to the sixth bit being selected in such a way that precisely two falling flanks and one rising flank are provided within the image frame. In this development, the first through the sixth bit may be realized in thirty-five different developments or combinations.

Furthermore, each bit or data frame has a weight, the weight being formed across the number of ones minus the number of zeroes within the image frame. The protocol provided in this variant is designed for an AC or alternating current coupling. In this way it results that the weight across all image frames of a data stream across a longer period of time is zero. In addition, it is possible to transmit the data explicitly in non-inverted or in inverted form.

In another development of this variant, a package is made up of a plurality of image or data frames, usually three, five or fifteen image frames. The first image frame of a package may define the number and the content of the image frames of the package. The additional image frames following within the package then include the data or images to be transmitted.

Moreover, five data bits per image frame having values from zero to thirty-one may be coded. In a further development, coding and weighting of the values is an option as well. DC balancing, i.e., direct current balancing, in order to allow AC coupling or alternating current coupling is likewise conceivable.

In this first variant, it is also possible to use two codes if no data are to be transmitted. This may be code "A" and code "B", for instance. These two codes are transmitted in alternation, one of these two codes having a weight of two, and the other code a weight of minus two. Another code is used to mark a start of a package. Following the start of the package, the second image frame of the package then includes 5 bits, this second image frame defining a package type (bits 4 through 0). In this context the zero and one bits define the type of package, i.e., whether an item of information, a read response or data are involved, for example. The second bit defines whether the data are transmitted in inverted or non-inverted form; the third and fourth bits are normally not used.

A format of the package (package format) in the case of different types of packages may be specified well. Typically, an item of information of a package is made up of three image frames, a first image frame coding the beginning of the package, a second image frame for the type of package being used to specify whether the data are transmitted in inverted form, and a third frame codes the information including a data backup.

A read response package in this example is made up of five image frames, a first frame coding the start of the package, a second frame coding the type and whether the data are transmitted in inverted form, the third through the fifth frame coding 15 bits of data, 12 bits being used for the read response data and the remaining 3 bits for the data backup of the transmitted data.

A package for data is made up of fifteen image frames, a first image frame coding the start of the package. A second image frame codes the type and whether the date are transmitted in inverted form. A third frame is used for the data backup. A fourth to fifteenth image frame code 60 bits of data, in this case, five pixels at 12 bits. Sixty cycles are required for the five pixels at 12 bits (60 bits). 24 bits are required per word.

Within the framework of the first variant, in a reception of a camera-link protocol for the single-line connection it is provided that an image or data frame is made up of 8 bits, from a zeroth to a seventh bit. Here, too, each data frame has two rising and two falling flanks.

In a refinement, one of the two flanks is always in the same position of the data frame. The additional two flanks are therefore located at changing positions of the data frame.

In this first variant, the transmitted data signal is divided by four in the receiver. This results in two potential output signals of a divider. As a rule, a correct flank is to be used in the receiver. The correct flank may be determined by checking a duty cycle of the data signal divided by four; here, the correct flank typically has to have a duty cycle of 50%.

In addition, the data signal divided by four corresponds to a bit clock divided by 16. The data signal divided by four also may be used as reference signal for a PLL (phase-locked loop) circuit. This PLL circuit generates a clock that is higher by a factor of 16. An output clock of the PLL circuit is also used for sampling the data signal. In addition, a position of the bit stream is detected through the use of known data words.

The following table 1 illustrates one example in a case where no data are transmitted. In this table 1 and also in the additional tables introduced, numbers of the data frames, or frames in brief, are entered in the first line, and a type is entered in the second line. These tables schematically illustrate a package structure. Each package both of the first and the second variant includes twenty-one frames or data frames in the described example.

This table 1 encompasses twenty-one frames, from zero to twenty, which have type "A" and "B" in alternation. "A" and "B" code that no data are transmitted.

TABLE 1

| | Frame | | | | | | | | | | | | | | | | | | | | |
|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 |
| Type | A | B | A | B | A | B | A | B | A | B | A | B | A | B | A | B | A | B | A | B | A |

The following table 2 represents an example according to which packet information is not inverted. The data frame "PS" (fourth frame) codes the beginning of the package. Data frame "I" codes the type of information that is not inverted. Data frame "D" (sixth frame) codes the type of information, including the data backup.

TABLE 2

| \multicolumn{21}{c}{Frame} |
| 0 | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|----|----|----|----|----|----|----|----|----|----|----|
| Type | ... | ... | ... | ... | PS | I | D | ... | ... | ... | ... | ... | ... | ... | ... | ... | ... | ... | ... | ... |

For inverted information of the package, the following table 3 is provided. Data frame "PS" codes the beginning of the package. Data frame "I_n" codes the type of information that is inverted. In addition, data frame "D" codes the type of information in an inverted representation, including the data backup.

TABLE 3

| \multicolumn{21}{c}{Frame} |
| 0 | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|----|----|----|----|----|----|----|----|----|----|----|
| Type | ... | ... | ... | ... | PS | I_n | D | ... | ... | ... | ... | ... | ... | ... | ... | ... | ... | ... | ... | ... |

Using table 4, an example of a read response package is shown which is not inverted. Data frame "PS" codes the beginning of the package. Data frame "R" codes the type of read response that is not inverted. Additional data frames "D1", "D2", "D3" code the read response data, including the data backup.

TABLE 4

| \multicolumn{21}{c}{Frame} |
| 0 | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|----|----|----|----|----|----|----|----|----|----|----|
| Type | ... | ... | ... | ... | PS | R | D1 | D2 | D3 | ... | ... | ... | ... | ... | ... | ... | ... | ... | ... | ... |

A composition of a read response package that is inverted is schematically illustrated with the aid of table 5. Data frame "PS" codes the beginning of the package. Data frame "R_n" codes the type of read response that is inverted. Data frames "D1", "D2", "D3" code the data of the read response in an inverted illustration, plus the data backup.

TABLE 5

| \multicolumn{21}{c}{Frame} |
| 0 | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|----|----|----|----|----|----|----|----|----|----|----|
| Type | ... | ... | ... | ... | PS | R_n | D1 | D2 | D3 | ... | ... | ... | ... | ... | ... | ... | ... | ... | ... | ... |

Table 6 shows an example of a data package that is not inverted. Here, too, data frame "PS" codes the beginning of the package. Data frame "D" codes the type of non-inverted data. Also provided data frame "DS" codes the data backup. The additional data frames "D1" through "D12" code the data having 60 bits at five pixels at 12 bits.

TABLE 6

| \multicolumn{21}{c}{Frame} |
| 0 | 1 | 2 | 3 | 4 | 5 | 6 | 7 | 8 | 9 | 1 | 11 | 12 | 13 | 14 | 15 | 16 | 17 | 18 | 19 | 20 |
|---|---|---|---|---|---|---|---|---|---|---|----|----|----|----|----|----|----|----|----|----|
| Type | ... | ... | PS | D | DS | D1 | D2 | D3 | D4 | D5 | D6 | D7 | D8 | D9 | D10 | D11 | D12 | ... | ... | ... |

Using table 7, an example of a data package that is inverted is illustrated. In this instance, a beginning of the package is coded by data frame "PS". Data frame D_n" codes the type of inverted data. Data frame "DS" codes the data backup, and data frames "D1" through "D12" code the data in an inverted representation at 60 bits, five pixels at 12 bits being provided.

TABLE 7

| Frame | | | | | | | | | | | | | | | | | | | | | |
|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 |
| Type | ... | ... | PS | D_n | DS | D1 | D2 | D3 | D4 | D5 | D6 | D7 | D8 | D9 | D10 | D11 | D12 | ... | ... | ... | ... |

The development of the described package types are based on the specification of the camera downlink of the Robert Bosch GmbH, as it is used according to the standard IVS 1.0, for example.

A second variant provides for a transmission of data frames having a bit length of 10 bits. For a camera-link protocol for a single-line connection, the specifications described in the following text are provided.

A data frame is made up of 10 bits, from a zeroth bit to a ninth bit. The zeroth bit is always 1, and the ninth bit is always 0. Bits 1 through 8 are used for coding and selected in such a way that precisely three falling and two rising flanks are provided. Thus, bits 1 through 8 may assume sixty-nine different forms or combinations. In all, each data frame has three rising and three falling flanks. Like in the case of the first variant for data frames having 8 bits, each data frame in the second variant also has a weight, which is calculated via the number of ones minus the number of zeros. Furthermore, the protocol provided for the transmission is also set up for AC-coupling and thus for alternating current coupling. Averaged across a longer period of time, the weight of the data stream is zero. In addition, it is possible to transmit the data explicitly either in non-inverted or in inverted form.

A package may be made up of a plurality of data frames such as 2, 3 or 12 data frames, for example. A first data frame of a package defines the number and the content of the data frames of the package. The following data frames contain the data. Six data bits having values from 0 through 63 are able to be coded per data frame, coding and a weight of the values being open. Moreover, DC balancing and thus direct current balancing to realize AC coupling is able to be provided.

Like in the first variant, codes "A" and "B" are used when no data are transmitted; in this case, these two codes are transmitted in alternation, one of the two codes having a weight of x and the other of -x. Three codes, which have a weight of zero, are used to define the content of the package. An item of information of the package is made up of two data frames, the first data frame coding the type, and the second data frame coding the information including the data backup.

is provided in the second data frame. The third and the fourth frames code the data, six bits per data frame being provided in each case.

In the second variant described, a package intended for transmission of the data is made up of twelve frames, a first frame coding the type, and a second frame coding whether the data are inverted or not inverted. This second frame also includes a data backup. The third up to and including the twelfth frame code the data, six bits per data frame being provided in each case. Furthermore, two data frames in each case code a twelve bit value, and twelve data frames code twelve bit values. All codes may be used within the data packages. For five pixels at 12 bits (60 bits), this requires one hundred and twenty cycles. A data word requires 24 bits.

In a camera link protocol for a single line connection, the parameters described in the following text are provided within the framework of the second variant. Each data frame is made up of 10 bits, i.e., from bit zero through bit nine. In addition, each data frame has three rising and three falling flanks. One of the three flanks is always at the same position of the data frame; two of the three flanks are situated at changing positions of the data frame.

A data signal received in a receiver is divided by six, the correct flank being used in the receiver. The correct flank is able to be determined by checking the pulse duty factor and thus the duty cycles, of the data signals divided by six. At the correct flank, the duty cycle has a value of 50%. Furthermore, the data signal divided by six corresponds to a bit clock divided by twenty. This data signal divided by six is used as reference signal for a PLL circuit, which generates a clock that is higher by a factor of 20. An output clock of the PLL circuit is used for sampling the data signal. In addition, it is possible to detect a position of the zeroth bits in the bit stream based on the known data words.

A structure of packages within the framework of the second variant for a camera-link protocol for single-line connections is illustrated in the following tables 8 through 11.

Table 8 shows a structure of a package of data frames in a case where no transmission of data is intended. The data frames "A" and "B" code that no data are transmitted.

TABLE 8

| Frame | | | | | | | | | | | | | | | | | | | | | |
|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 |
| Type | A | B | A | B | A | B | A | B | A | B | A | B | A | B | A | B | A | B | A | B | A |

A read response normally is made up of four data frames, a first data frame coding the type, and it being specified via coding of the second data frame whether the data are inverted or not inverted. Furthermore, coding regarding a data backup A structure of an information package is described in table 9. The data frame denoted by "I" codes the type of information. Data frame "D" codes whether the data are inverted. In addition, data frame "D" includes the data backup.

TABLE 9

| Frame | | | | | | | | | | | | | | | | | | | | | |
|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 |
| Type | ... | ... | ... | ... | I | D | ... | ... | ... | ... | ... | ... | ... | ... | ... | ... | ... | ... | ... | ... | ... |

A structure of a read response package is described in the following table 10.

Here, data frame "R" codes the type of read response. Data frame "RID" codes whether the data are inverted and also the data backup. Data frames "D1", "D2" code the read response data.

TABLE 10

| Frame | | | | | | | | | | | | | | | | | | | | | |
|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 |
| Type | ... | ... | ... | ... | R | RID | D1 | D2 | ... | ... | ... | ... | ... | ... | ... | ... | ... | ... | ... | ... | ... |

One specific development of a data package in the second variant is shown in table 11. Data frame "DP" codes the type of data. Data frame "DID" codes whether the data are inverted and also relates to the data backup. The data frames from "D1" through "D11" code the data, 5 pixels at 12 bits, i.e., 60 bits, being provided.

TABLE 11

| Frame | | | | | | | | | | | | | | | | | | | | | |
|---|---|---|---|---|---|---|---|---|---|---|---|---|---|---|---|---|---|---|---|---|---|
| | 0 | 1 | 2 | 3 | 4 | 5 | 6 | 7 | 8 | 9 | 1 | 11 | 12 | 13 | 14 | 15 | 16 | 17 | 18 | 19 | 20 |
| Type | ... | ... | DP | DID | DS | D1 | D2 | D3 | D4 | D5 | D6 | D7 | D8 | D9 | D10 | | ... | ... | ... | ... | |

In this case as well, the types of packages code according to the specifications of the camera downlink of the Robert Bosch GmbH, as it is used according to the IVS 1.0 standard. The use of a protocol is able to be demonstrated by a logic analyzer, for instance.

The exemplary embodiments and/or exemplary methods of the present invention is suitable for use in cameras, for example, a transmission protocol using only a single line being provided for the transmission of the data from the camera to the control device. In addition, an integration into an imager or a device for providing images using suitable specific interfaces is possible.

Additional advantages and refinements of the exemplary embodiments and/or exemplary methods of the present invention are yielded from the description and the accompanying drawings.

It is understood that the features mentioned above and the features yet to be described below may be used not only in the combination given in each case but also in other combinations or individually, without departing from the scope of the present invention.

DETAILED DESCRIPTION

The exemplary embodiments and/or exemplary methods of the present invention is represented schematically in the drawings in light of exemplary embodiments, and is described in detail below with reference to the drawing.

Figure 1:
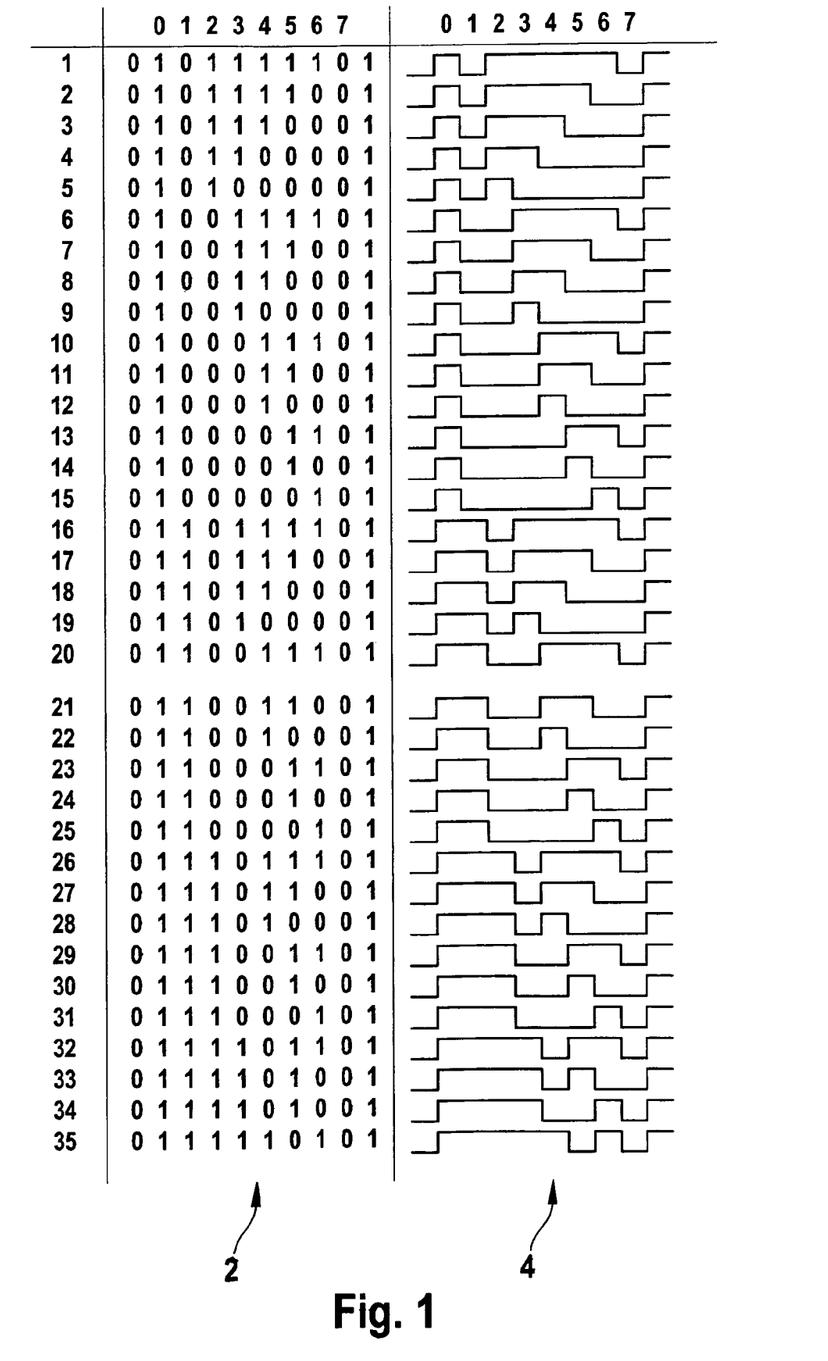
FIG. 1 shows examples of a structure of data frames having a bit length of 8 bits in a schematic illustration.

FIG. 1 schematically illustrates the structure of the data frames of the first variant described above, which all have a bit length of 8 bits. Overall, thirty-five different developments of data frames are realizable in this context, which are shown in the table from FIG. 1. A second column 2 of the table shows a numerical structure of the data words having zeros and ones. For the 8 bits from zero through 7, numbering is specified in a first line of this second column 2. A third column 4 illustrates the timing of the total of thirty-five developments of data frames encompassing rectangular signals, the 8 bits being numbered consecutively from a zeroth bit to a seventh bit in the first line of the third column 4.

It is provided that all thirty-five developments of data frames have a constant number of flanks and thus transitions between zero and one of the rectangular signal, i.e., two rising flanks and two falling flanks. In addition, a starting bit has the value 0, and an ending bit has the value 1 in each case. The eight data bits from 0 through 7 are consecutively numbered to provide the constant number of flanks.

Figure 2A:
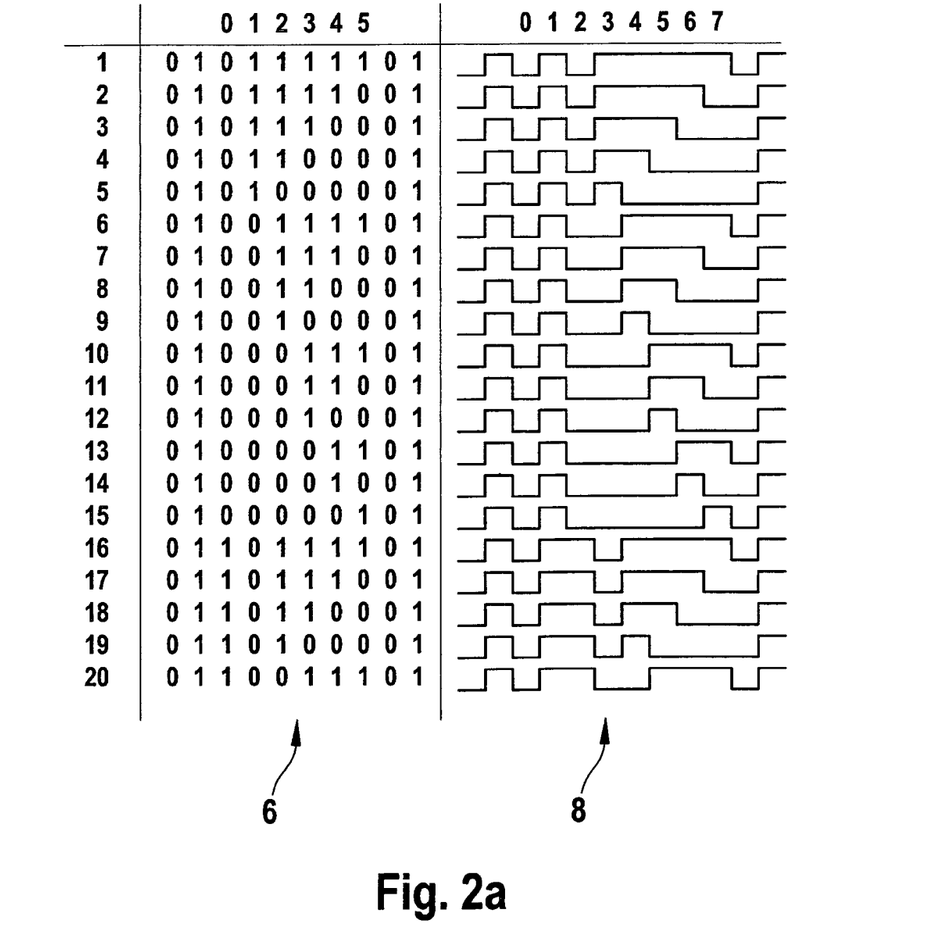
FIGS. 2A, 2B and 2C show examples of a structure of data frames having a bit length of 10 bits in a schematic illustration.
Figure 2B:
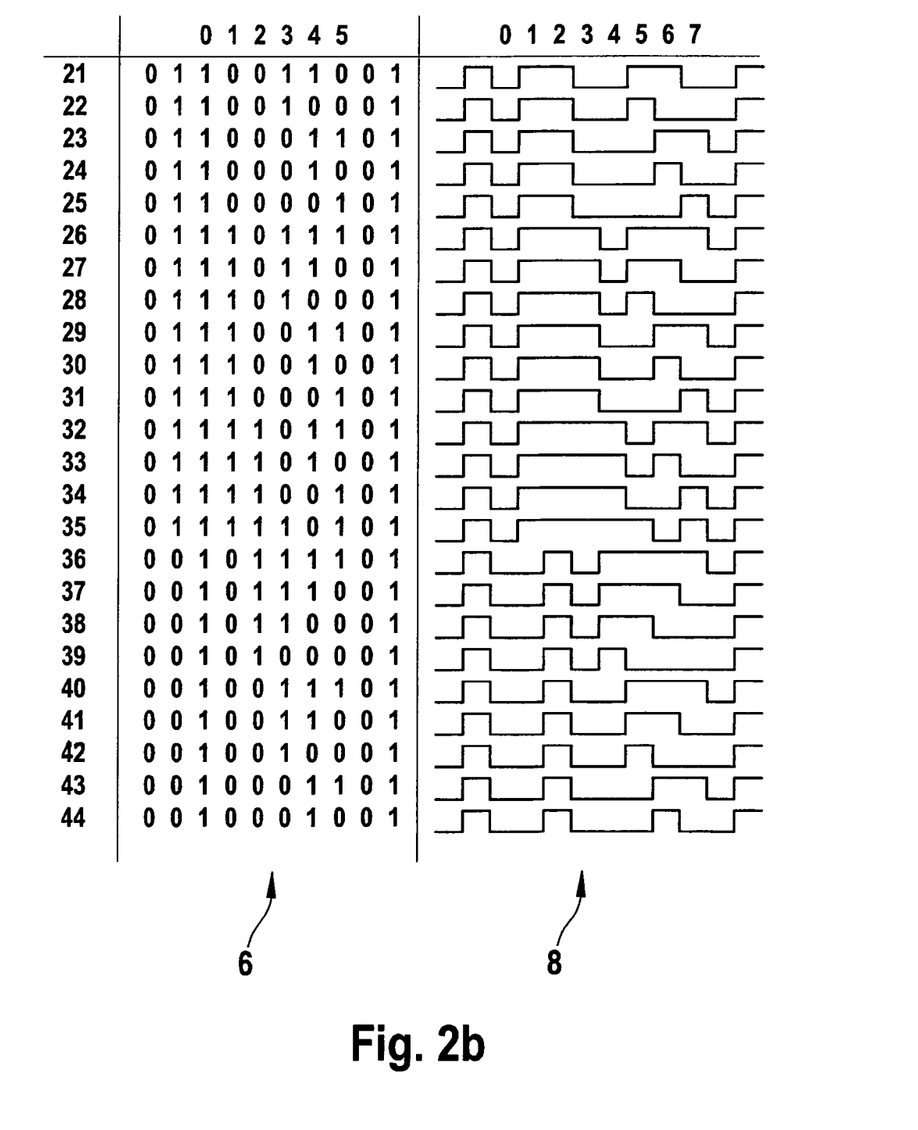
Figure 2C:
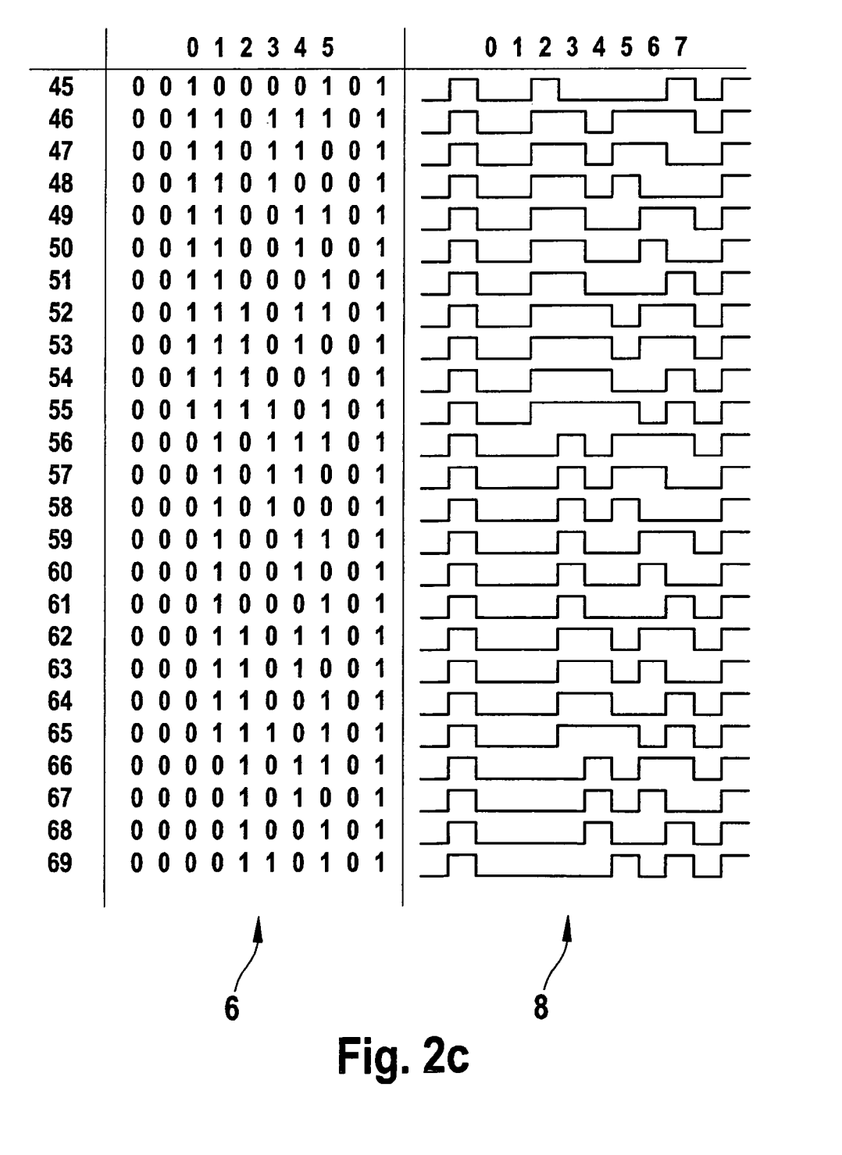

With regard to the second variant of data frames described above, which all have a bit length of 10 bits, reference is made to FIG. 2, this FIG. 2 being subdivided into three figures, i.e., FIGS. 2a, 2B, and FIG. 2c. In the second variant of data frames, a total of sixty-nine developments is possible; in a first section of the table, in FIG. 2a, the embodiments 1 through 20 are shown, in a second section of the table, in FIG. 2b, the developments 21 through 44, and in a third section of the table, in FIG. 2c, the developments 45 through 69.

A second column 6 of the table shown in FIGS. 2a through 2c illustrates a numerical structure of the data frames according to zeroes and ones. A third column 8 of this table shows a timing of these altogether sixty-nine developments of rectangular signals of the data frames having a bit length of 10 bits. All sixty-nine developments of the data frames have a constant number of flanks, i.e., three rising flanks, that is to say, three transitions from zero to one, and three falling flanks, and thus three transitions from one to zero.

Figure 3:
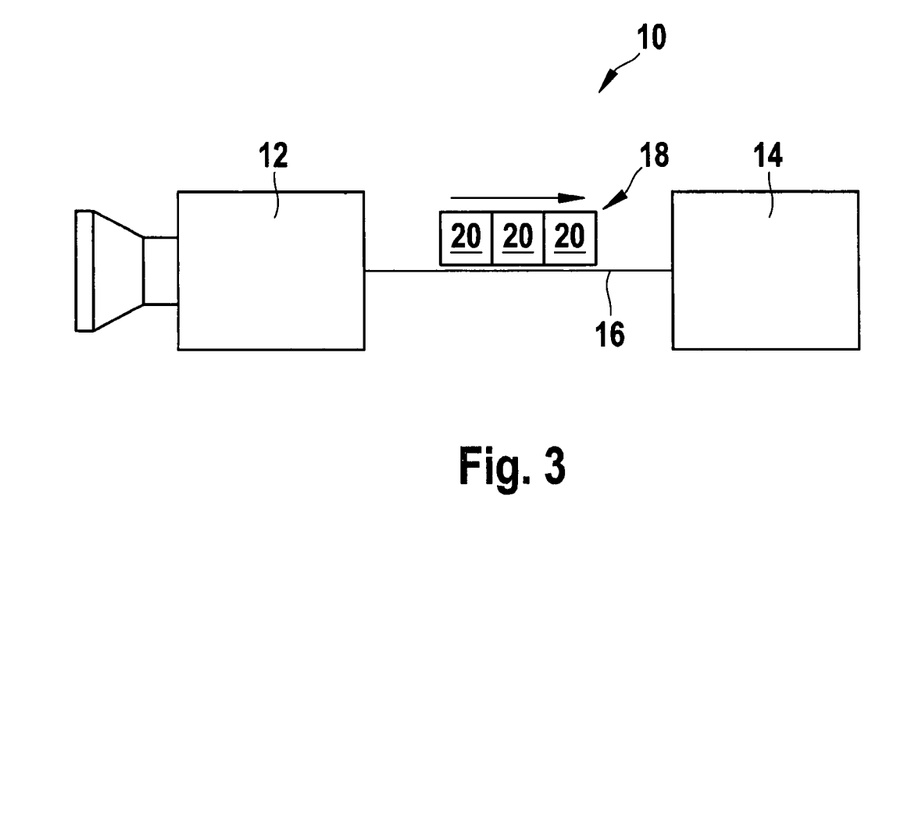
FIG. 3 shows a specific embodiment of a system according to the present invention in a schematic illustration.

FIG. 3 shows a schematic illustration of a specific embodiment of a system 10 according to the exemplary embodiments and/or exemplary methods of the present invention, which is designed to execute a development of a method according to the present invention. This system includes a camera 12, which is designed to record images and thus audio-visual data. In addition, this system includes a control device 14, which is connected to the camera via a connection 16. Starting from camera 12 as transmitter, a package 18, which includes three data frames 20 in the present specific embodiment, is transmitted via connection 16 to control device 14 as receiver. All three data frames 20 have a constant number of flanks.

What is claimed is:

1. A method for transmitting image data over a single line from a data source implemented as a camera to a control device, the method comprising:
    encoding the image data from the camera in a plurality of data frames;
    temporally adjusting each data frame to include a constant number of flanks;
    transmitting a data signal including the encoded data frames over the single line to the control device;
    dividing the data signal received at the control device; and
    generating, at a phase lock loop (PLL) circuit, a clock signal from the divided data signal to sample the data signal received at the control device;
    wherein the image data is transmitted on the single line using differential transmission.

2. The method of claim 1, wherein the data is transmitted from the camera to the control device using a protocol.

3. The method of claim 1, wherein the data frames are clocked.

4. The method of claim 1, wherein the constant number of the flanks is defined by a bit length of the data frames.

5. The method of claim 1, wherein two rising flanks and two falling flanks are used for data frames having a length of 8 bits.

6. The method of claim 1, wherein three rising flanks and three falling flanks are used for data frames having a length of 10 bits.

7. A system for transmitting image data over a single line from a data source implemented as a camera to a control device, comprising:
    an encoding arrangement to encode the image data from the camera in a plurality of data frames;
    a transmitting arrangement to transmit a data signal including the encoded data frames over the single line to the control device;
    an adjusting arrangement to temporally adjust data frames of data so that the data frames have a constant number of flanks;
    a dividing arrangement to divide the data signal received at the control device; and
    a phase lock loop (PLL) circuit to generate a clock signal from the divided data signal to sample the data signal;
    wherein the image data is transmitted on the single line using differential transmission.

8. The system of claim 7, further comprising:
    a module configured to provide a protocol intended for the transmission of the data.

9. A non-transitory computer readable medium having a computer program, which is executable by a processor, comprising:
    a program code arrangement having program code for transmitting image data over a single line from a data source implemented as a camera to a control device, including by:
    encoding the image data from the camera in a plurality of data frames;
    temporally adjusting each data frame to include a constant number of flanks; and
    transmitting a data signal including the encoded data frames over the single line to the control device;
    wherein the data signal is divided at the control device and a phase lock loop (PLL) circuit generates a clock signal from the divided data signal to sample the data signal at the control device, and
    wherein the image data is transmitted on the single line using differential transmission.

10. The computer readable medium of claim 9, wherein the data is transmitted from the camera to the control device using a protocol.

11. The computer readable medium of claim 9, wherein the data frames are clocked.

12. The computer readable medium of claim 9, wherein the constant number of the flanks is defined by a bit length of the data frames.

13. The computer readable medium of claim 9, wherein two rising flanks and two falling flanks are used for data frames having a length of 8 bits.

14. The computer readable medium of claim 9, wherein three rising flanks and three falling flanks are used for data frames having a length of 10 bits.

* * * * *